(12) United States Patent
Jang

(10) Patent No.: US 11,419,216 B2
(45) Date of Patent: Aug. 16, 2022

(54) DISPLAY DEVICE AND METHOD OF MANUFACTURING THE SAME

(71) Applicant: Samsung Display Co., Ltd., Yongin-si (KR)

(72) Inventor: Joo-Nyung Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/095,887

(22) Filed: Nov. 12, 2020

(65) Prior Publication Data

US 2021/0307174 A1    Sep. 30, 2021

(30) Foreign Application Priority Data

Mar. 30, 2020   (KR) .................. 10-2020-0038482

(51) Int. Cl.
*H05K 1/18*   (2006.01)
*H05K 1/11*   (2006.01)

(52) U.S. Cl.
CPC .......... *H05K 1/189* (2013.01); *H05K 1/111* (2013.01); *H05K 2201/10128* (2013.01); *H05K 2201/10151* (2013.01)

(58) Field of Classification Search
CPC .................. H05K 1/189; H05K 1/111; H05K 2201/10128; H05K 2201/10151
USPC ....................................................... 361/749
See application file for complete search history.

(56) References Cited

U.S. PATENT DOCUMENTS

| 8,576,368 B2 | 11/2013 | Kim et al. |
| 9,991,614 B2 | 6/2018 | Hayashi et al. |
| 10,177,129 B2 | 1/2019 | Namkung et al. |
| 10,651,162 B2 | 5/2020 | Namkung et al. |
| 2008/0180376 A1* | 7/2008 | Kim ........................ H01L 24/90 345/92 |

(Continued)

FOREIGN PATENT DOCUMENTS

| JP | 1994-180459 | 6/1994 |
| JP | 2000-183470 | 6/2000 |

(Continued)

OTHER PUBLICATIONS

Sang-Hoon Lee et al., Nanofiber Anisotropic Conductive Films (ACF) for Ultra-Fine-Pitch Chip-on-Glass (COG) Interconnections, Journal of Electronic Materials, vol. 44, No. 11, 2015, pp. 4628-4636.

*Primary Examiner* — Binh B Tran
(74) *Attorney, Agent, or Firm* — H.C. Park & Associates, PLC

(57) ABSTRACT

A display device includes: a panel including a plurality of panel pads; a circuit board including a plurality of connection pads corresponding to the plurality of panel pads, respectively; and a layer disposed between the panel and the circuit board and including a plurality of conductive particles. The layer includes: an overlapping portion that overlaps the plurality of panel pads and the plurality of connection pads in a first direction; and a non-overlapping portion that does not overlap the plurality of panel pads and the plurality of connection pads in the first direction. In the non-overlapping portion, the conductive particles are adjacent to one side of one panel pad of adjacent panel pads in a second direction intersecting the first direction.

17 Claims, 16 Drawing Sheets

(56) References Cited

U.S. PATENT DOCUMENTS

| | | | |
|---|---|---|---|
| 2013/0335940 A1* | 12/2013 | Matsui | H01L 24/16 361/783 |
| 2017/0271299 A1 | 9/2017 | Li et al. | |
| 2017/0338198 A1 | 11/2017 | Jang et al. | |
| 2017/0352967 A1 | 12/2017 | Hayashi et al. | |
| 2017/0357122 A1* | 12/2017 | Oh | G02F 1/13452 |
| 2019/0256675 A1 | 8/2019 | Miyake et al. | |

FOREIGN PATENT DOCUMENTS

| | | |
|---|---|---|
| JP | 2005-129757 | 5/2005 |
| JP | 6221285 | 11/2017 |
| KR | 10-0149721 | 6/1998 |
| KR | 10-1115686 | 3/2012 |
| KR | 10-1309319 | 9/2013 |
| KR | 10-2017-0056662 | 5/2017 |
| KR | 10-2017-0082135 | 7/2017 |
| KR | 10-2017-0130003 | 11/2017 |
| KR | 10-2017-0130675 | 11/2017 |
| KR | 10-2018-0003716 | 1/2018 |
| KR | 10-1929697 | 12/2018 |
| KR | 10-2019-0057090 | 5/2019 |
| KR | 10-2020-0145985 | 12/2020 |

\* cited by examiner

DISPLAY DEVICE AND METHOD OF MANUFACTURING THE SAME

CROSS REFERENCE TO RELATED APPLICATION

This application claims priority from and the benefit of Korean Patent Application No. 10-2020-0038482, filed on Mar. 30, 2020, which is hereby incorporated by reference for all purposes as if fully set forth herein.

BACKGROUND

Field

Exemplary implementations of the invention relate generally to a display device and a method of manufacturing the display device, and more specifically, to a display device which includes a bonding layer having conductive particles that couple a display panel to a circuit board, and a method of manufacturing the same.

Discussion of the Background

Electronic apparatuses such as display devices include a plurality of circuit lines and a plurality of electronic elements connected thereto and operate according to electrical signals. Conductive bonding members have been used to electrically connect the plurality of circuit lines to the plurality of electronic elements. For example, an anisotropic conductive film (ACF) or the like has been used to electrically connect a display panel to a circuit board in the display devices.

Further, as high resolutions are required in the display devices, a bonding member for bonding to high-definition circuit lines is required.

The above information disclosed in this Background section is only for understanding of the background of the inventive concepts, and, therefore, it may contain information that does not constitute prior art.

SUMMARY

Applicant has discovered that when conductive particles are used to electrically connect pads of a display panel and a circuit board in a display device, a short circuit may occur between adjacent pads of the display panel and the circuit board due to the conductive particles.

Display devices constructed according to the principles and exemplary implementations of the invention prevent the short circuit between the adjacent pads of the display panel and the circuit board due to the conductive particles by disposing the conductive particles in a non-overlapping portion, which does not overlap the pads of the display panel and the circuit board, to be closer to one pad of the adjacent pads than another pad of the adjacent pads, and thus, the excellent reliability may be achieved even in a case having the pads which are arranged in high definition to achieve the high resolution.

Methods of manufacturing the display device according to the principles and exemplary of the invention are capable of preventing the short circuit between the adjacent pads of the display panel and the circuit board due to the conductive particles by controlling the movement of the conductive particles in a bonding layer provided between the display panel and the circuit board, and thus, the display device having the excellent reliability even in high resolution may be provided.

In addition, display devices constructed according to the principles and exemplary implementations of the invention provide improved reliability by controlling arrangement of conductive particles included in a bonding layer.

Further, methods of manufacturing the display device according to the principles and exemplary of the invention are capable of having improved reliability by providing a bonding layer that has the conductive particles having different arrangement characteristics between in a overlapping portion of the bonding layer, which overlaps the pads, and in a non-overlapping portion of the bonding layer, which does not overlap the pads.

Additional features of the inventive concepts will be set forth in the description which follows, and in part will be apparent from the description, or may be learned by practice of the inventive concepts.

According to an embodiment, a display device includes: a panel including a plurality of panel pads; a circuit board including a plurality of connection pads corresponding to the plurality of panel pads, respectively; and a layer disposed between the panel and the circuit board and including a plurality of conductive particles, wherein the layer includes: an overlapping portion that overlaps the plurality of panel pads and the plurality of connection pads in a first direction; and a non-overlapping portion that does not overlap the plurality of panel pads and the plurality of connection pads in the first direction, wherein, in the non-overlapping portion, the conductive particles are adjacent to one side of one panel pad of adjacent panel pads in a second direction intersecting the first direction.

In an embodiment, the non-overlapping portion, the conductive particles may be in electrical contact with the one side of the one panel pad.

In the non-overlapping portion, the conductive particles may be insulated from another panel pad of the adjacent panel pads.

The plurality of panel pads may include a first panel pad and a second panel pad adjacent to each other, and wherein: the non-overlapping portion may not overlap the first panel pad and the second panel pad in the first direction, and the plurality of conductive particles in the non-overlapping portion may be spaced apart from a first side surface of the first panel pad and may be adjacent to a second side surface of the second panel pad adjacent to the first side surface in the second direction.

In the non-overlapping portion, the conductive particles may be closer to the second side surface than the first side surface based on a virtual center line at a same distance from the first side surface and the second side surface.

The conductive particles may be randomly arranged in the overlapping portion.

The panel may be a display panel, the circuit board is a flexible circuit board, and on a plane parallel to the display panel, the conductive particles in the overlapping portion may not be in contact with each other.

On a plane parallel to the panel, the conductive particles adjacent to the one side of the one panel pad may be aligned in a single layer in the second direction.

The layer may be a bonding layer, the bonding layer may further include resin, and gaps between the panel pads and the connection pads may be filled with the resin.

The overlapping portion may include the conductive particles formed in a single layer between the plurality of panel pads and the plurality of connection pads in the first direction.

The conductive particles in the overlapping portion may not overlap each other in the first direction.

The display device may further include: an input sensor disposed on the panel and including a plurality of sensing pads; a sensing flexible circuit board including a plurality of sensing connection pads corresponding to the plurality of sensing pads, respectively; and a sensing bonding layer disposed between the input sensor and the sensing flexible circuit board and including a plurality of conductive particles, wherein the sensing bonding layer may include: a sensing overlapping portion overlapping the plurality of sensing pads and the plurality of sensing connection pads in the first direction; and a sensing non-overlapping portion that may not overlap the plurality of sensing pads and the plurality of sensing connection pads in the first direction, wherein, in the sensing non-overlapping portion, the conductive particles may be disposed adjacent to one side of one sensing pad of adjacent sensing pads.

According to another embodiment, a display device includes: a display panel including a plurality of panel pads; a flexible circuit board including a plurality of connection pads corresponding to the plurality of panel pads, respectively; and a bonding layer disposed between the display panel and the flexible circuit board and including a plurality of conductive particles, wherein the bonding layer includes: a plurality of overlapping portions, each of which overlaps a corresponding panel pad and a corresponding connection pad in a first direction; and a plurality of non-overlapping portions, each of which does not overlap the corresponding panel pad and the corresponding connection pad in the first direction, wherein, in the non-overlapping portions, the conductive particles are adjacent to one side surface of a m-th panel pad of the plurality of panel pads in a second direction intersecting the first direction and are spaced apart from another side surface of the m-th panel pad, where m is an integer greater than zero.

The conductive particles in the non-overlapping portion and between overlapping portions overlapping a (m−1)-th panel pad and the m-th panel pad of the plurality of panel pads, respectively, may be spaced apart from the (m−1)-th panel pad and are adjacent to the m-th panel pad.

The conductive particles, adjacent to the one side surface of the m-th panel pad, may be in electrical contact with the m-th panel pad on the one side surface.

According to another embodiment, a method of manufacturing a display device may includes the steps of: providing a display panel including a plurality of panel pads, on a stage inclined at a predetermined angle; disposing a preliminary bonding layer including a plurality of conductive particles, on the panel pads; providing a flexible circuit board including a plurality of connection pads, on the preliminary bonding layer; preliminarily bonding the display panel, the preliminary bonding layer, and the flexible circuit board, sequentially, in a pressing manner; and providing heat to the display panel, the preliminary bonding layer, and the flexible circuit board after the step of preliminarily bonding.

The preliminary bonding layer may include overlapping portions that may overlap the panel pads and the connection pads and non-overlapping portions that may not overlap the panel pads and the connection pads, and in the step of preliminary bonding, the plurality of conductive particles in the overlapping portions may be in electrical contact with the panel pads and the connection pads facing each other.

The step of providing of the heat may include the step of moving the conductive particles in the non-overlapping portions, toward a lower panel pad of two adjacent panel pads.

The predetermined angle may be greater than about 0 degree and about 90 degrees or less.

The preliminary bonding layer may include resin filling gaps between the conductive particles are filled, wherein, the step of providing of the heat may include the steps of: performing a flowing process of reducing viscosity of the resin; and performing a curing process of fixing the resin and the conductive particles, after the flowing process, and transforming the preliminary bonding layer into a bonding layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
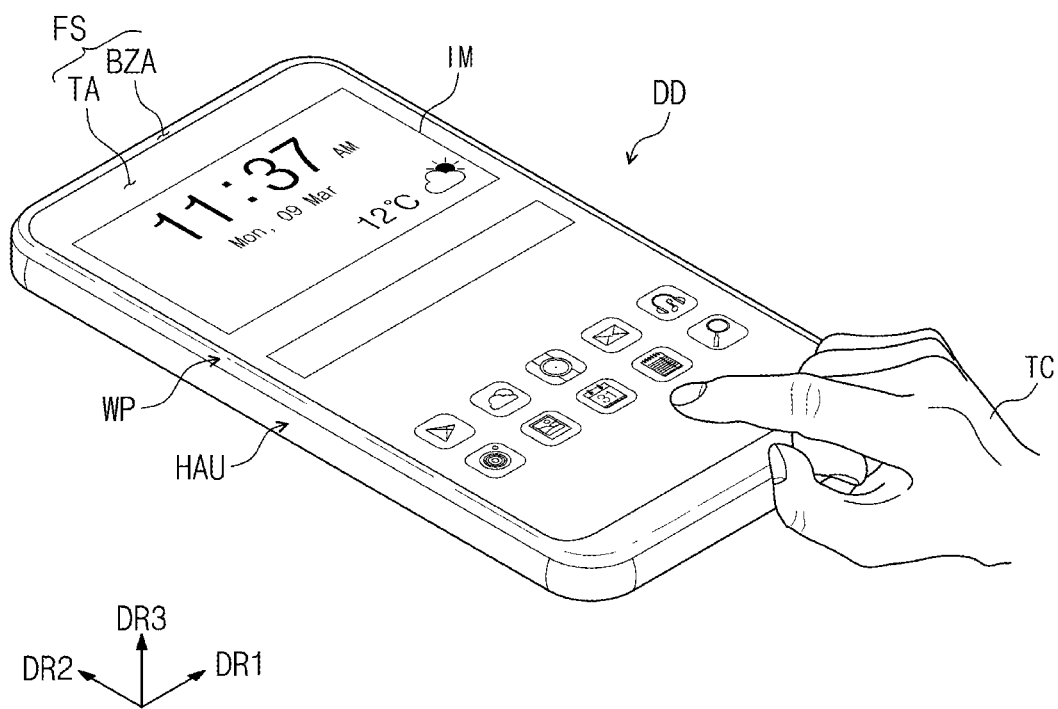
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to embodiments and an electronic apparatus including the same will be described with reference to the drawings.

Figure 2:
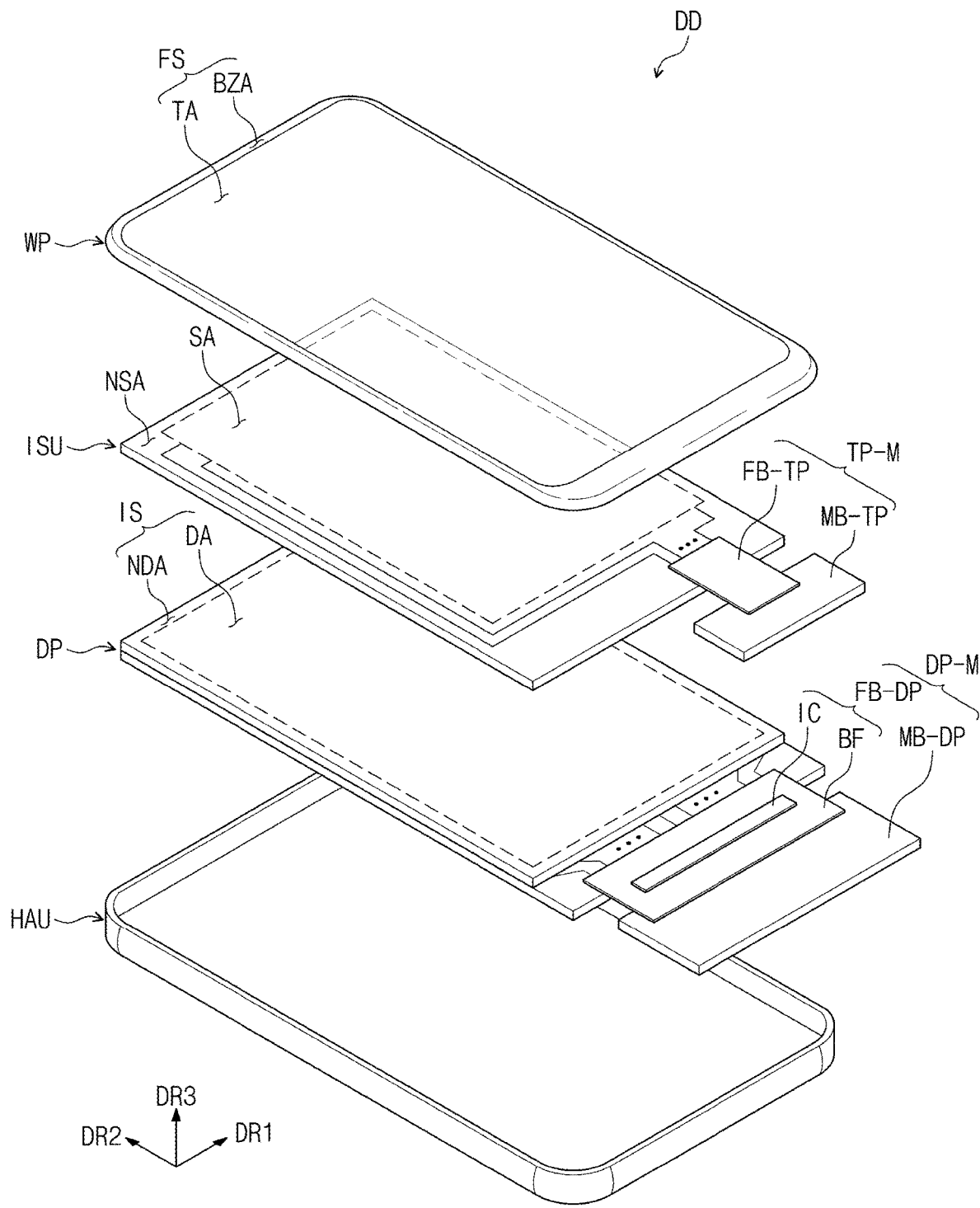
FIG. 2 is an exploded perspective view of the display device of FIG. 1.
Figure 3:
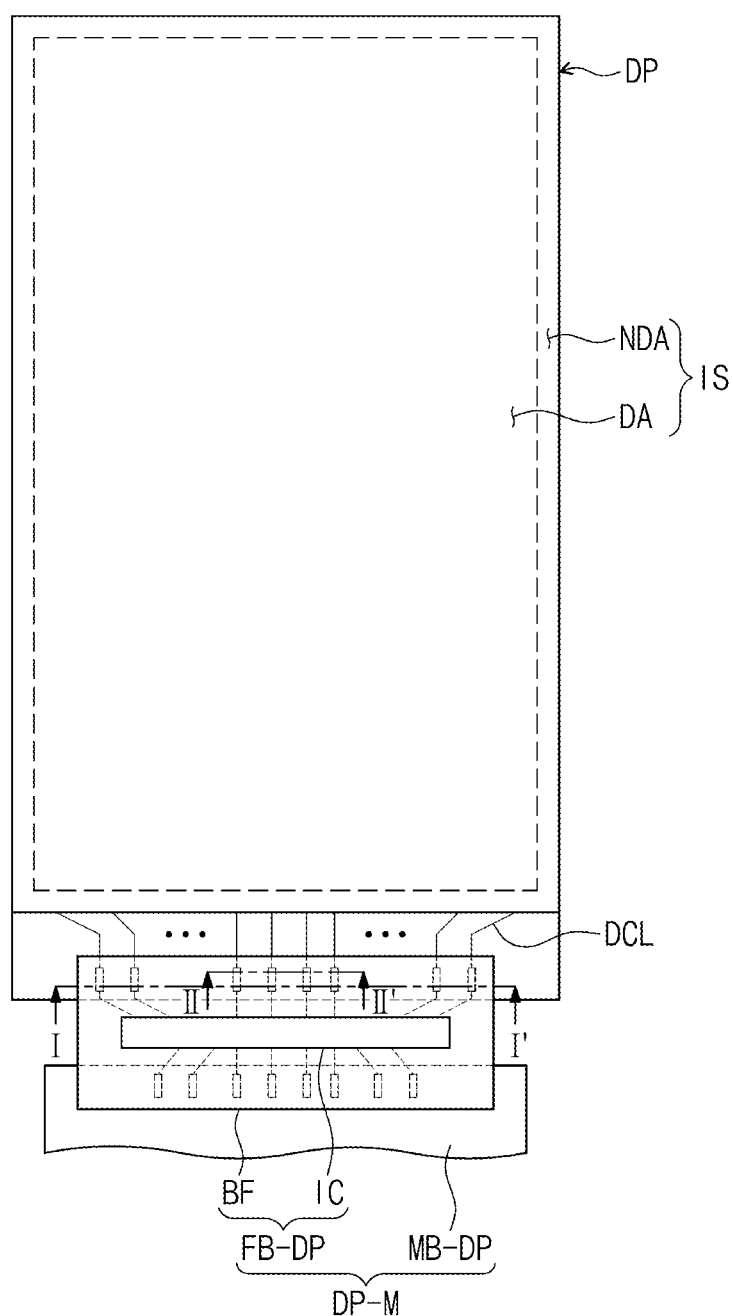
FIG. 3 is a plan view of a display panel and a panel driving part of the display device of FIG. 2.
Figure 4:
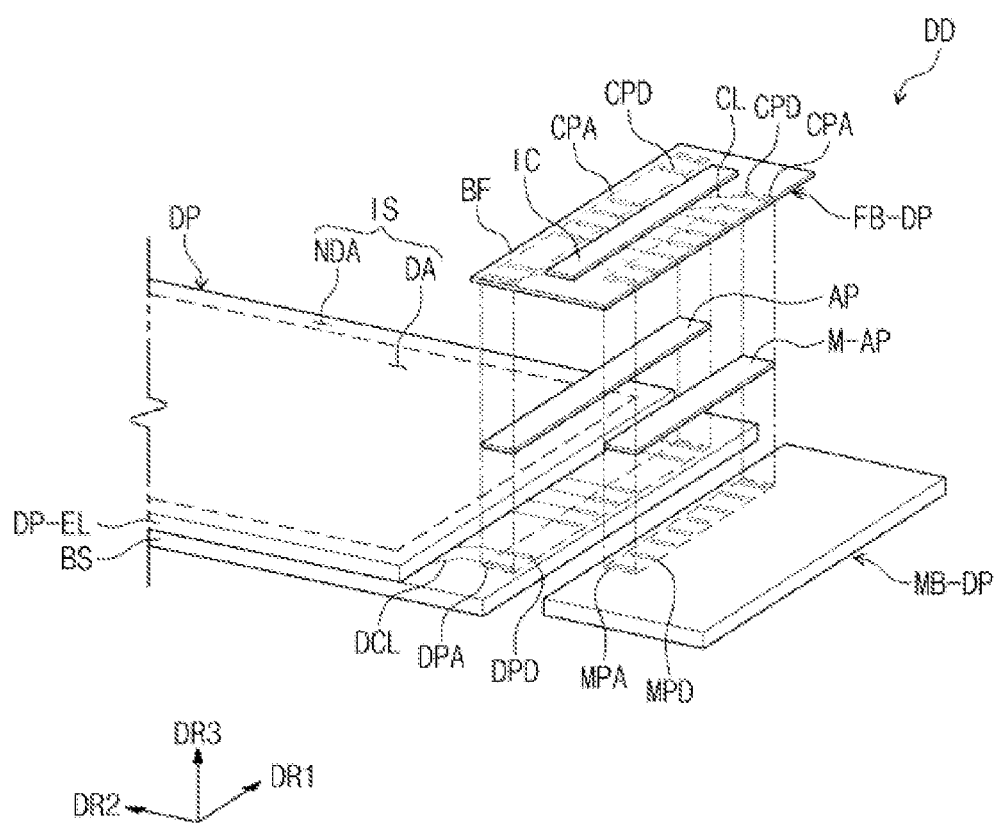
FIG. 4 is an exploded perspective view of the display panel and the panel driving part of FIG. 3.

FIG. 1 is a perspective view of an embodiment of a display device constructed according to the principles of the invention. FIG. 2 is an exploded perspective view of the display device of FIG. 1. FIG. 3 is a plan view of a display panel and a panel driving part of the display device of FIG. 2. FIG. 4 is an exploded perspective view for the display panel and the panel driving part of FIG. 3.

A display device DD may be a device to be activated in response to an electrical signal. The display device DD may include various embodiments. For example, the display device DD may be a personal computer, a laptop computer, a personal digital terminal, a vehicle navigation unit, a game console, a smart phone, a tablet, or a camera. These are merely provided as embodiments, and thus, other display devices may be employed as long as not departing from the embodiments. The display device DD is illustratively shown as a smart phone.

Here, in the following drawings including FIG. 1, a first directional axis DR1, a second directional axis DR2, and a third directional axis DR3 are illustrated. The directions indicated as the first directional axis DR1, the second directional axis DR2, and the third directional axis DR3 in the specification may have a relative concept and thus be changed to other directions.

For convenience of description, the direction of the third directional axis DR3 in the specification is defined as a direction for providing a user with an image. Also, the first directional axis DR1 is perpendicular to the second directional axis DR2, and the third directional axis DR3 may be a normal direction of the plane defined by the first directional axis DR1 and the second directional axis DR2.

Figure 8:
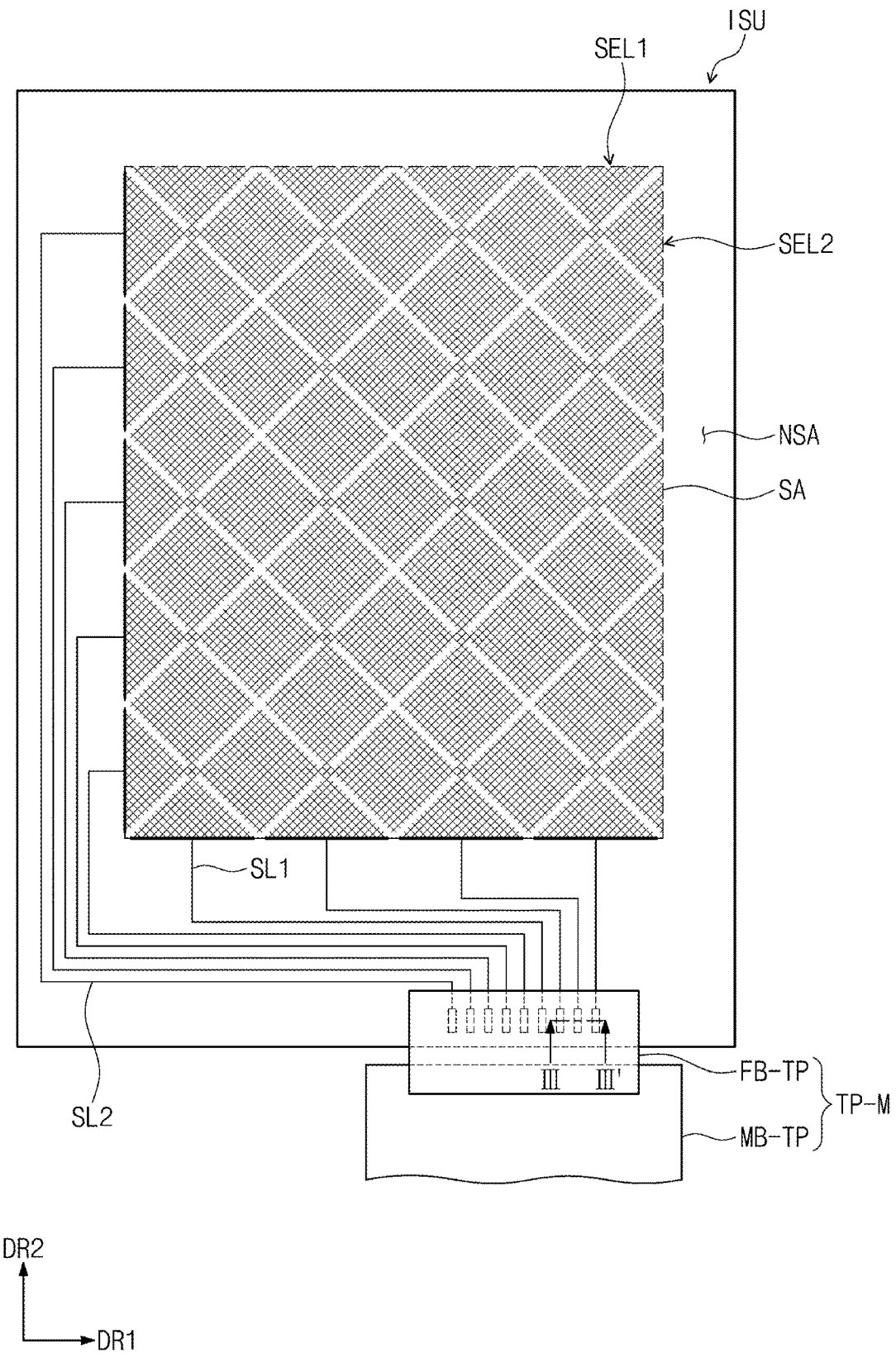
FIG. 8 is a plan view of an input sensor and a sensing driving part of the display device of FIG. 2.

Referring to FIG. 4, the display device DD may include a panel in the form of a display panel DP, a panel driving part DP-M including a circuit board in the form of a flexible circuit board FB-DP, and a layer in the form of a bonding layer AP. For example, the display device DD may include a display panel DP including a plurality of panel pads DPD, a flexible circuit board FB-DP including a plurality of connection pads CPD that respectively correspond to the panel pads DPD, and a bonding layer AP disposed between the display panel DP and the flexible circuit board FB-DP. Referring to FIG. 8, the display device DD may further include an input sensor in the form of an input sensor ISU and a sensing driving part TP-M. For example, the display device DD includes a window WP and a housing HAU, and the window WP and the housing HAU may be coupled to each other to define an exterior of the display device DD.

For example, the input sensor ISU and the sensing driving part TP-M may be omitted in the display device DD. For example, the input sensor ISU may be disposed directly on the display panel DP and provided integrally with the display panel DP.

In an embodiment, the display device DD may display an image IM, in a direction of the third directional axis DR3, on a display surface FS parallel to the plane defined by the first directional axis DR1 and the second directional axis DR2. The display surface FS on which the image IM is displayed may correspond to a front surface of the display device DD and also may correspond to a front surface FS of the window WP. Hereinafter, the same reference symbol is used to denote the display surface and the front surface of the display device DD and the front surface of the window WP. The image IM may include static images as well as dynamic images. In FIG. 1, a watch window and application icons are illustrated as examples of the image IM.

According to the embodiment, the window WP may include an optically transparent insulating material. The window WP may include a transmission area TA and a bezel area BZA. The front surface FS of the window WP including the transmission area TA and the bezel area BZA corresponds to the front surface FS of the display device DD. A user may view an image that is provided through the transmission area TA corresponding to the front surface FS of the display device DD.

The transmission area TA may be an optically transparent area. The bezel area BZA may be an area having a relatively lower light transmittance than the transmission area TA. The bezel area BZA may have a predetermined color. The bezel area BZA is adjacent to the transmission area TA and may surround the transmission area TA. The bezel area BZA may define a shape of the transmission area TA. However, embodiments are not limited thereto. The bezel area BZA may be disposed adjacent to only one side of the transmission area TA, or a portion thereof may be omitted.

The display panel DP may be disposed below the window WP. In the specification, the term "below" indicates a direction opposite to the direction in which the display panel DP displays the image.

The display panel DP may be configured to generate the image IM. The image IM generated by the display panel DP is displayed on a display surface IS and is viewed by the user from the outside through the transmission area TA.

For example, the display panel DP may be a liquid crystal display panel or a light emitting display panel. For example, the display panel DP may be a liquid crystal display panel including liquid crystal elements, an organic electroluminescence display panel including organic electroluminescence elements, or a quantum-dot light emitting display panel including quantum-dot light emitting elements. However, embodiments are not limited thereto.

The display panel DP may include a display area DA and a non-display area NDA. For example, the liquid crystal elements, the organic electroluminescence elements, the quantum-dot light emitting elements, or the like may be disposed on the display area DA of the display panel DP.

The display panel DP may include the display surface IS that includes the display area DA and the non-display area NDA. The display area DA may be an area that is activated in response to an electrical signal. The non-display area NDA may be an area to be covered by the bezel area BZA. The non-display area NDA is adjacent to the display area DA. The non-display area NDA may surround the display area DA. A driving circuit, a driving line, or the like for driving the display area DA may be disposed in the non-display area NDA. A panel pad area DPA may be disposed in the non-display area NDA.

The display panel DP may include a base substrate BS and a display layer DP-EL disposed on the base substrate BS. For example, when the display panel DP is a light emitting display panel, the display layer DP-EL may include a light emitting element layer and an encapsulation layer.

The base substrate BS may serve as a member for providing a base surface on which the display layer DP-EL is disposed. The base substrate BS may be a glass substrate, a metal substrate, or a plastic substrate. However, embodiments are not limited thereto. For example, the base substrate BS may be an inorganic layer, an organic layer, or a composite material layer. The base substrate BS may be a flexible substrate which may be easily bent or folded.

For example, the base substrate BS may be a transparent glass substrate or a transparent polyimide substrate. Further, the base substrate BS may be an opaque polyimide substrate.

A plurality of panel pads DPD may be disposed on the non-display area NDA of the display panel DP. The plurality of panel pads DPD may be spaced apart from each other in the panel pad area DPA. Referring to FIGS. 3 and 4, the plurality of panel pads DPD are aligned spaced a certain distance from each other while forming a single row along the first directional axis DR1, but embodiments are not limited thereto. For example, the plurality of panel pads DPD may be aligned while forming a plurality of rows, i.e., two or more rows. For example, gaps between the plurality of panel pads DPD may be different from each other, or the plurality of panel pads DPD may be aligned in an oblique direction while having different slopes relative to the second directional axis DR2.

The panel pads DPD may be connected to display connection lines DCL and thus electrically connected to a circuit layer of the display panel DP. The circuit layer is disposed on the base substrate BS and may include a switching transistor, a driving transistor, and the like for driving a plurality of light emitting elements included in the display layer DP-EL.

The display device DD may include a panel driving part DP-M. The panel driving part DP-M may include a flexible circuit board FB-DP. The flexible circuit board FB-DP may be disposed on one side of the display panel DP. However, embodiments are not limited thereto.

The flexible circuit board FB-DP may include a plurality of connection pads CPD. The flexible circuit board FB-DP may include a base film BF and the plurality of connection pads CPD disposed on the base film BF. The base film BF may include a flexible material, for example, a polyimide.

The flexible circuit board FB-DP may include a connection pad area CPA. The plurality of connection pads CPD may be disposed on the connection pad area CPA so as to respectively correspond to the plurality of panel pads DPD.

Referring to FIGS. 3 and 4, the display device DD may include the flexible circuit board FB-DP and a panel driving board MB-DP. The flexible circuit board FB-DP is disposed between the display panel DP and the panel driving board MB-DP and may be electrically connected to the display panel DP and the panel driving board MB-DP.

The panel driving part DP-M may include a driving chip IC. The driving chip IC may be mounted in the flexible circuit board FB-DP. The driving chip IC may be connected to signal lines CL of the flexible circuit board FB-DP and thus electrically connected to the display panel DP. The driving chip IC may generate and process various electrical signals. The flexible circuit board FB-DP may be referred to as a chip on film (CoF).

The flexible circuit board FB-DP may be electrically and physically connected to the display panel DP through a bonding layer AP. The bonding layer AP may be disposed between the display panel DP and the flexible circuit board FB-DP. Further, the display device DD may include a driving bonding layer M-AP which electrically and physically connects the flexible circuit board FB-DP to the panel driving board MB-DP. The panel driving board MB-DP may include a driving pad area MPA. A plurality of driving pads MPD may be disposed on the driving pad area MPA of the panel driving board MB-DP. The driving bonding layer M-AP may be to bond the driving pads MPD to the connection pads CPD that are arranged to respectively correspond to the driving pads MPD.

The bonding layer AP may be disposed between the panel pad area DPA and the connection pad area CPA. For example, the bonding layer AP may be disposed between the panel pads DPD and the connection pads CPD which are disposed to face and correspond to each other.

Figure 5:
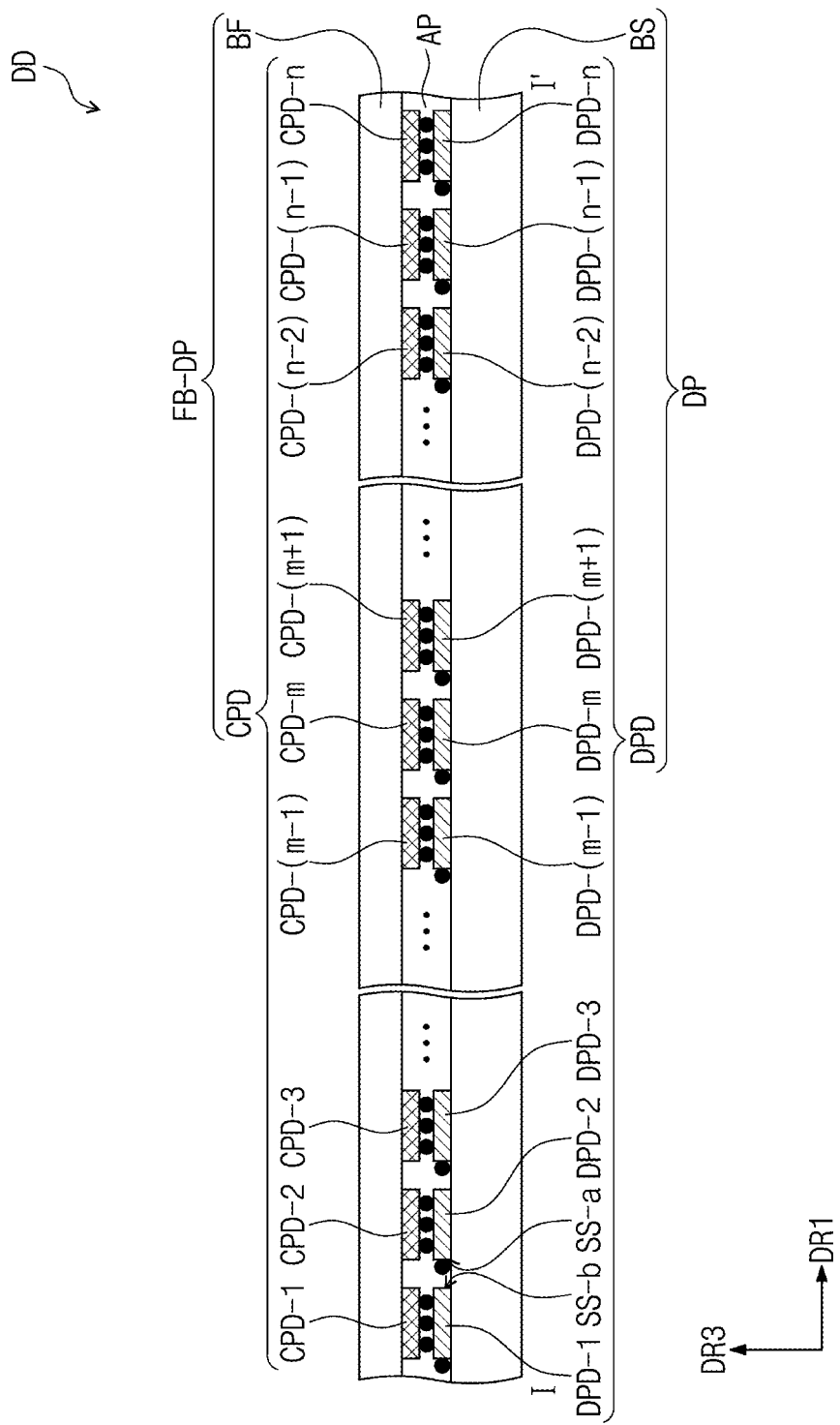
FIG. 5 is a cross-sectional view taken along line I-I' of FIG. 3.
Figure 6:
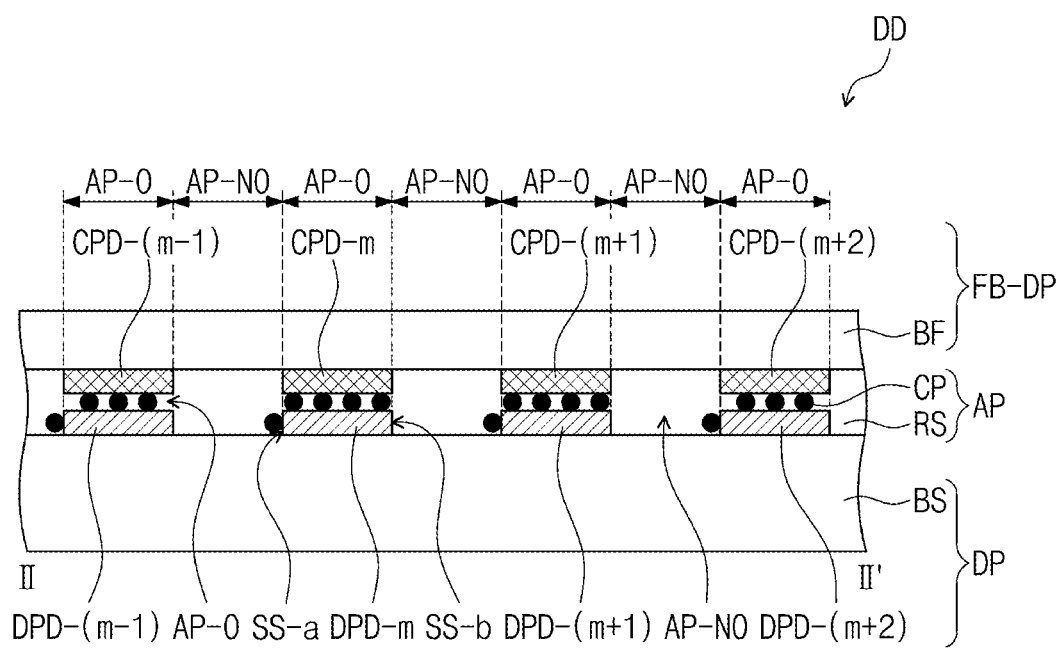
FIG. 6 is a cross-sectional view taken line II-II' of FIG. 3.
Figure 6:
Figure 7A:
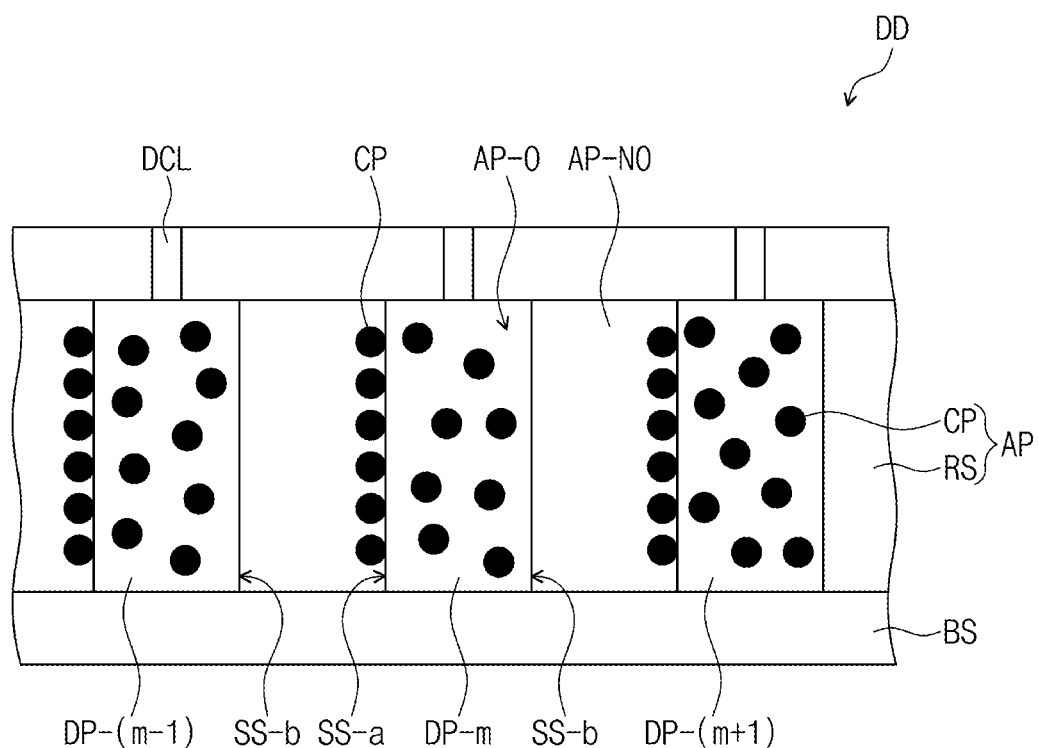
FIG. 7A is a plan view of an embodiment of the display panel and the flexible circuit board of FIG. 5.
Figure 7B:
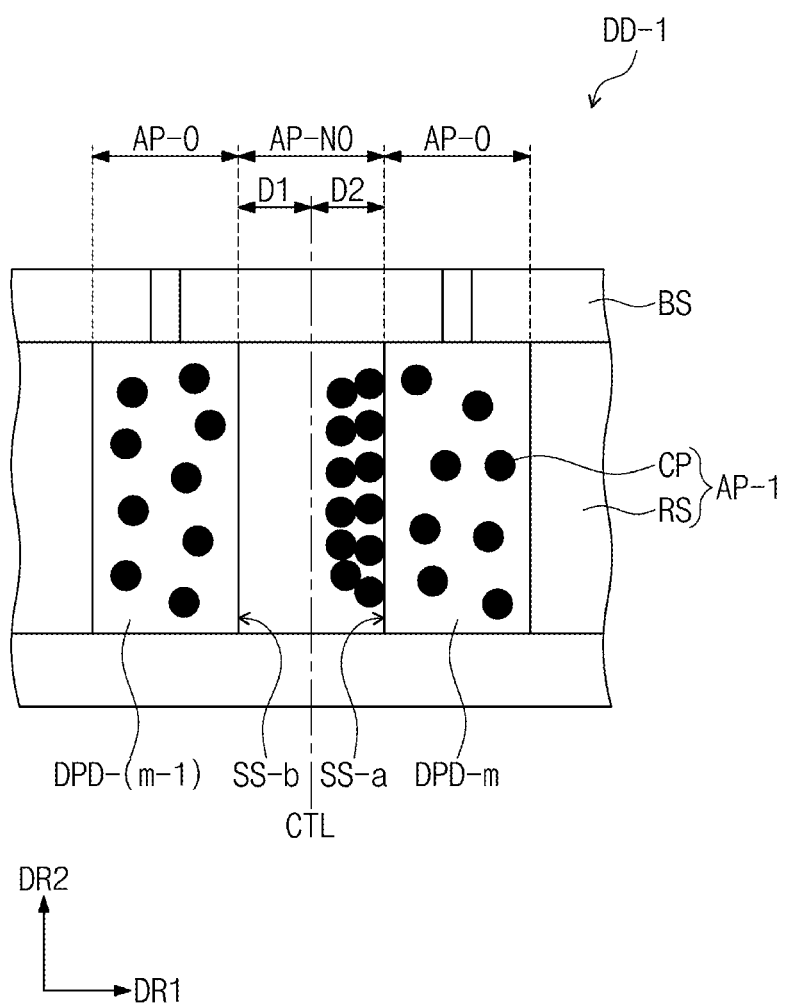
FIG. 7B is a plan view of another embodiment of the display panel and the flexible circuit board of FIG. 7A.

Each of FIGS. 5 and 6 is a cross-sectional view of a portion of the display device of the embodiment. FIG. 5 is a cross-sectional view taken line I-I' of FIG. 3, and FIG. 6 is a cross-sectional view taken line of FIG. 3. Each of FIGS. 7A and 7B is a plan view of a portion of the display device of the embodiment. Each of FIGS. 7A and 7B is a plan view illustrating a portion of the display panel on which the bonding layer is attached.

Referring to FIGS. 5 and 6, the bonding layer AP may include a plurality of conductive particles CP. The bonding layer AP may be an anisotropic conductive film (ACF). The bonding layer AP may include the plurality of conductive particles CP and resin RS with which spaces between the plurality of conductive particles CP are filled.

Each of the conductive particles CP may be a metal particle or an alloy particle in which several metals are mixed. For example, the conductive particle CP may be a metal or metal alloy particle including at least one of silver, copper, bismuth, zinc, indium, tin, nickel, cobalt, chromium, or iron. For example, the conductive particle CP may have a core portion made of a polymer resin or the like and a coating layer made of a conductive material surrounding the core portion.

The bonding layer AP may include overlapping sections AP-O and non-overlapping sections AP-NO. Each of the overlapping sections AP-O is a portion that overlaps the panel pad DPD and the connection pad CPD, and each of the non-overlapping sections AP-NO is a portion that does not overlap the panel pad DPD and the connection pad CPD. The overlapping section AP-O in the bonding layer AP corresponds to an area that overlaps the panel pad DPD and the connection pad CPD facing each other. The non-overlapping section AP-NO may be a portion disposed between the overlapping sections AP-O. The bonding layer AP may include the overlapping sections AP-O and the non-overlapping sections AP-NO which are alternately disposed.

In the display device DD, the conductive particles CP of the non-overlapping section AP-NO are disposed adjacent to one side of one panel pad DPD of the neighboring panel pads. For example, in the overlapping section AP-O, the conductive particles CP may be disposed between the panel pad DPD and the connection pad CPD disposed to correspond to the panel pad DPD. The conductive particles CP may be distributed in the overlapping section AP-O. For example, in the overlapping section AP-O, the conductive particles CP may be distributed on the panel pad DPD. For example, in the non-overlapping section AP-NO, the conductive particles CP may be concentrated on one side.

For example, among the conductive particles CP included in the bonding layer AP, the conductive particles CP disposed between two neighboring panel pads DPD-1 and DPD-2 may be disposed adjacent to one side SS-a of the one panel pad DPD-2 of the two neighboring panel pads DPD-1 and DPD-2. Here, in the specification, the one side SS-a and one side surface SS-a are illustrated using the same reference symbol. For example, the one side may include the one side surface.

The conductive particles CP contained in the non-overlapping section AP-NO disposed between the two neighboring panel pads DPD-1 and DPD-2 may come into contact with the one side of the one panel pad DPD-2 of the two neighboring panel pads DPD-1 and DPD-2. For example, the conductive particles CP in the non-overlapping section AP-NO may be in electrical contact with the one panel pad DPD-2 of the two neighboring panel pads DPD-1 and DPD-2 but insulated from the other panel pad DPD-1.

The bonding layer AP may include resin RS. The spaces between the conductive particles CP are filled with the resin RS of the bonding layer AP. Each of the resin RS may include a polymer material. The resin RS may include at least one of an acryl-based polymer, a silicon-based polymer, a urethane-based polymer, or an imide-based polymer. For example, the resin RS may include one polymer material or a combination of a plurality of polymer materials which are selected from among an acryl-based polymer, a silicon-based polymer, a urethane-based polymer, and an imide-based polymer. The resin RS may be made of an acryl-based polymer, a silicon-based polymer, a urethane-based polymer, or an imide-based polymer. For example, the resin RS may be a portion which is formed by heat-curing or photo-curing a base resin such as an acryl-based polymer, a silicon-based polymer, a urethane-based polymer, or an imide-based polymer.

Referring to FIGS. 5, 6, 7A, and 7B, the display panel DP includes n panel pads DPD-1, DPD-2, . . . , DPD-(n−1), and DPD-n that are arranged in a direction of the first directional axis DR1. The flexible circuit board FB-DP includes n connection pads CPD-1, CPD-2, . . . , CPD-(n−1), and CPD-n that are arranged in the direction of the first directional axis DR1. The n connection pads CPD-1, CPD-2, . . . , CPD-(n−1), and CPD-n are arranged to correspond to the n panel pads DPD-1, DPD-2, . . . , DPD-(n−1), and DPD-n, respectively. Here, n is integer 2 or more.

In the embodiment, the panel pads DPD-1, DPD-2, . . . , DPD-(n−1), and DPD-n may include the first panel pad DPD-1 and the second panel pad DPD-2 that neighbor each other. The non-overlapping section AP-NO of the bonding layer AP may not overlap the first panel pad DPD-1 and the second panel pad DPD-2. The conductive particles CP contained in the non-overlapping section AP-NO may be spaced apart from a first side surface SS-b of the first panel pad DPD-1 and disposed adjacent to a second side surface SS-a of the second panel pad DPD-2. The first side surface SS-b of the first panel pad DPD-1 and the second side surface SS-a of the second panel pad DPD-2 may be side surfaces adjacent to each other. Here, this configuration is described as an example, and may be applied, in the same manner, to the neighboring panel pads DPD other than the first and second panel pads DPD-1 and DPD-2. For example, the conductive particles CP contained in the non-overlapping sections AP-NO may be disposed adjacent to one side surface SS-a of m-th panel pad DPD-m and disposed spaced apart from the other side surface SS-b of the m-th panel pad DPD-m. Here, in the specification, m is an integer of 1 to n.

In the embodiment, among the conductive particles CP contained in the bonding layer AP, the conductive particles CP contained in the non-overlapping sections AP-NO may be disposed adjacent only to the one side of each of the panel pads DPD. Referring to FIGS. 5 and 6, on the cross-section defined by the first directional axis DR1 and the third directional axis DR3, all the conductive particles CP contained in the non-overlapping sections AP-NO may be disposed adjacent to left side surfaces of the panel pads DPD. Alternatively, all the conductive particles CP contained in the non-overlapping sections AP-NO may be disposed adjacent to right side surfaces of the panel pads DPD.

Among the conductive particles CP which do not overlap the m-th panel pad DPD-m and are disposed on both sides of the m-th panel pad DPD-m, the conductive particles CP disposed in a direction of one side surface SS-a of the m-th panel pad DPD-m may be electrically connected to the m-th panel pad DPD-m. Alternatively, the conductive particles CP disposed in a direction of the other side surface SS-b of the m-th panel pad DPD-m may be disposed spaced apart from the m-th panel pad DPD-m.

The conductive particles CP contained in the non-overlapping section AP-NO, which does not overlap two panel pads DPD-(m−1) and DPD-m disposed adjacent to each other in the direction of the first directional axis DR1 and is disposed between the two panel pads DPD-(m−1) and DPD-m, may be spaced apart from the (m−1)-th panel pad DPD-(m−1) and disposed adjacent to the m-th panel pad DPD-m. For example, the conductive particles CP contained in the non-overlapping section AP-NO, which does not overlap two panel pads DPD-m and DPD-(m+1) disposed adjacent to each other in the direction of the first directional axis DR1 and is disposed between the two panel pads DPD-m and DPD-(m+1), may be spaced apart from the m-th panel pad DPD-m and disposed adjacent to the (m+1)-th panel pad DPD-(m+1). In the embodiment, the conductive particles disposed in the non-overlapping sections that do not overlap the panel pads may be disposed adjacent to one panel pad of the two neighboring panel pads and spaced apart from the other panel pad.

The conductive particles CP contained in the bonding layer AP may be disposed in a single layer between the panel pad DPD and the connection pad CPD. For example, in the overlapping section AP-O of the bonding layer AP, the conductive particles CP may not overlap each other in a thickness direction. In the overlapping section AP-O, the conductive particles CP are distributed on a plane parallel to the plane defined by the first directional axis DR1 and the second directional axis DR2 but are not staked in the direction of the third directional axis DR3. For example, the thickness of the overlapping section AP-O, which is defined as a gap between the panel pad DPD and the connection pad CPD, may be substantially the same as the diameter of the conductive particle CP disposed between the panel pad DPD and the connection pad CPD.

The display device includes the bonding layer in which the conductive particles to be disposed between the panel pads are disposed adjacent to the one panel pad of the neighboring panel pads and thus may have the improved electrical reliability. The embodiment may provide the display device which includes the bonding layer, in which the conductive particles to be disposed between the two panel pads are disposed adjacent to the one panel pad, and solves a short-circuit problem caused by the conductive particles disposed between the neighboring panel pads.

Referring to FIGS. 5, 6, and 7A, the conductive particles CP disposed in the non-overlapping section AP-NO are aligned while forming a single row along the second directional axis DR2, but embodiments are not limited thereto. Referring to FIG. 7B, in a display device DD-1 according to an embodiment, conductive particles CP contained in each of non-overlapping sections AP-NO of a bonding layer AP-1 may not form a single row. The conductive particles CP contained in the non-overlapping section AP-NO may be randomly disposed while being adjacent to one side surface SS-a of one panel pad DPD-m of two panel pads DPD-(m−1) and DPD-m which neighbor each other with the non-overlapping section AP-NO therebetween. For example, the conductive particles CP in the non-overlapping section AP-NO may be disposed in a plurality of rows while being adjacent to the one side surface SS-a of the one panel pad DPD-m.

Figure 7C:
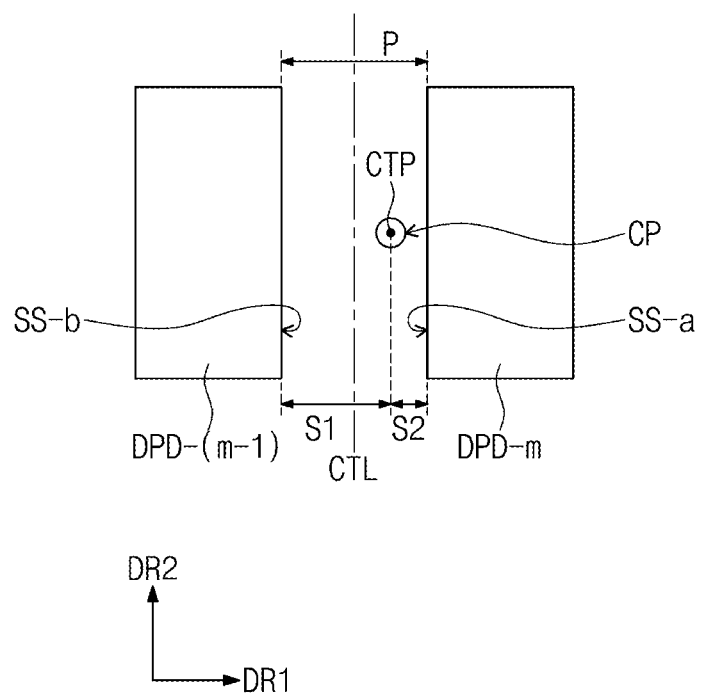
FIG. 7C is a plan view illustrating arrangement of conductive particles in a non-overlapping portion that does not overlap pads of the display panel and the flexible circuit board of FIG. 5.

However, even when disposed in the plurality of rows, the conductive particles CP, which are contained in the non-overlapping section AP-NO disposed between two neighboring panel pads DPD-(m−1) and DPD-m, may be disposed closer to one side surface SS-a with respect to a virtual center line CTL which is at the same distance from two neighboring side surfaces SS-a and SS-b. For example, referring to FIG. 7B, the conductive particles CP, which are contained in the non-overlapping section AP-NO disposed between the two neighboring panel pads DPD-(m−1) and DPD-m, may be disposed closer to the side surface SS-a of the m-th panel pad DPD-m with respect to the virtual center line CTL which is at the same distance (i.e., D1 and D2 are equal to each other) from the side surface SS-b of the (m−1)-th panel pad DPD-(m−1) and the side surface SS-a of the m-th panel pad DPD-m. For example, the conductive particles CP of the non-overlapping section AP-NO may be disposed between the virtual center line CTL and the side surface SS-a of the m-th panel pad DPD-m. Referring to FIG. 7C, a center point CTP of the conductive particles CP contained in the non-overlapping section AP-NO disposed between the two panel pads DPD-(m−1) and DPD-m may be disposed closer to the side surface SS-a of the m-th panel pad DPD-m than the side surface SS-b of the (m−1)-th panel pad DPD-(m−1) with respect to the virtual center line CTL.

FIG. 7C is a schematic plan view of arrangement of the conductive particles between the panel pads. When a minimum gap P is between the two panel pads DPD-(m−1) and DPD-m, the virtual center line CTL may be defined at a position of P/2 from the one side surface SS-b of the (m−1)-th panel pad DPD-(m−1).

Referring to FIG. 7C, a gap S1 between the conductive particle CP disposed between the two panel pads DPD-(m−1) and DPD-m and the side surface SS-b of the (m−1)-th panel pad DPD-(m−1) may be greater than a gap of P/2. For example, a gap S2 between the conductive particle CP and the side surface SS-a of the m-th panel pad DPD-m may be less than the gap of P/2. For example, the gaps S1 and S2 between the conductive particle CP and the panel pads DPD-(m−1) and DPD-m correspond to distances defined with respect to the center point CTP of the conductive particle CP.

The gap S1 between the conductive particle CP and the side surface SS-b of the (m−1)-th panel pad DPD-(m−1) may be greater than a maximum distance in which a short circuit may occur between the conductive particle CP and the (m−1)-th panel pad DPD-(m−1). For example, the gap S2 between the conductive particle CP and the side surface SS-a of the m-th panel pad DPD-m may be less than or equal to a minimum distance in which a short circuit may occur between the conductive particle CP and the m-th panel pad DPD-m. Here, the minimum distance in which a short circuit may occur between the conductive particle CP and the panel pad DPD may be changed by electrical properties such as permittivity of the conductive particle CP used and the resin RS contained in the bonding layer AP.

For example, the conductive particles CP may be sufficiently spaced apart from the one panel pad DPD-(m−1) of the two neighboring panel pads DPD-(m−1) and DPD-m at a distance in which a short circuit may not occur. The conductive particles CP may come into electrical contact with or be disposed adjacent to the other panel pad DPD-m. Accordingly, since the conductive particles CP contained in the non-overlapping section AP-NO of the bonding layer AP is sufficiently spaced apart from one panel pad of the two neighboring panel pads, a short circuit phenomenon does not occur between the two panel pads.

Here, the descriptions for the bonding layer AP described with reference to FIGS. 5 to 7C may be applied, in the same manner, to the driving bonding layer M-AP. For example, among conductive particles contained in the driving bonding layer M-AP, the conductive particles in portions not overlapping the driving pads MPD may be disposed adjacent to one side of one driving pad MPD of the neighboring driving pads MPD.

Figure 9:
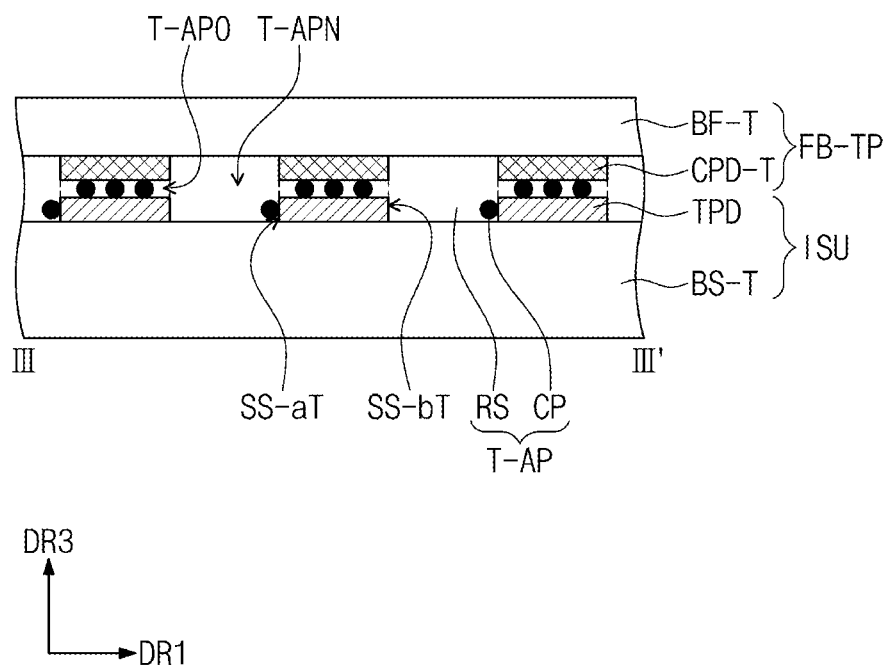
FIG. 9 is a cross-sectional view taken line of FIG. 8.

FIG. 8 is a cross-sectional view of an input sensor and a sensing driving part of the display device of FIG. 2. FIG. 8 illustrates the input sensor ISU and the sensing driving part TP-M included in the display device DD (FIG. 2) of the embodiment. FIG. 9 is a cross-sectional view taken line of FIG. 8.

Referring to FIGS. 2, 8, and 9, in the display device DD, the input sensor ISU may be provided as a separate member on the display panel DP. However, the input sensor ISU may be disposed directly on the display panel DP. For example, the input sensor ISU may be disposed directly on the display panel DP.

The input sensor ISU may sense an external input TC (FIG. 1) to acquire information about the position and intensity of the external input. For example, the external input includes various types of external inputs such as a portion of the body of a user, light, heat, pressure, or the like. For example, the input sensor ISU may sense an input that comes into contact with the input sensor ISU and an input that is adjacent thereto or approaches the same.

The input sensor ISU may include a sensing area SA and a non-sensing area NSA. The sensing area SA may overlap the display area DA. The non-sensing area NSA may be adjacent to the sensing area SA. The non-sensing area NSA may surround edges of the sensing area SA. Alternatively, the non-sensing area NSA may be adjacent to only a portion of the edges of the sensing area SA or be omitted. However, embodiments are not limited thereto.

The input sensor ISU may include a plurality of sensing electrodes SEL1 and SEL2, a plurality of sensing lines SL1 and SL2, and a plurality of sensing pads TPD. The sensing electrodes SEL1 and SEL2 may be disposed in the sensing area SA, and the sensing pads TPD may be disposed in the non-sensing area NSA. The sensing pads TPD may be disposed adjacent to an end of one side of the input sensor ISU.

The sensing lines SL1 and SL2 may be connected to the sensing electrodes SEL1 and SEL2 and may extend to the non-sensing area NSA and then be connected to the sensing pads TPD. The sensing pads TPD may be connected, through a sensing flexible circuit board FB-TP, to a sensing driving board MB-TP for driving the input sensor ISU.

The sensing electrodes SEL1 and SEL2 and the sensing lines SL1 and SL2 may have a single-layered structure or a multi-layered structure in which the electrodes or lines are stacked in an upward direction. The sensing electrodes SEL1 and SEL2 and the sensing lines SL1 and SL2 may be provided on a sensing base substrate BS-T. The sensing base substrate BS-T may be a glass substrate, a metal substrate, a plastic substrate, or the like. However, embodiments are not limited thereto, and the sensing base substrate BS-T may be an inorganic layer, an organic layer, or a composite material layer.

Here, when the input sensor ISU is disposed directly on the display panel DP, the sensing base board BS-T may be omitted. In this case, the sensing electrodes SEL1 and SEL2 and the sensing lines SL1 and SL2 may be provided directly on the display panel DP.

The sensing electrodes SEL1 and SEL2 may include a plurality of first sensing electrodes SEL1 and a plurality of second sensing electrode SEL2. The sensing lines SL1 and SL2 may include a plurality of first sensing lines SL1 connected to the first sensing electrodes SEL1 and a plurality of second sensing lines SL2 connected to the second sensing electrodes SEL2.

The first sensing electrodes SEL1 may be insulated from the second sensing electrodes SEL2 and extend to intersect the same. The first sensing electrodes SEL1 and the second sensing electrodes SEL2 may have a mesh shape. Capacitance may be formed by the first sensing electrodes SEL1 and the second sensing electrodes SEL2.

The sensing driving part TP-M may include a sensing flexible circuit board FB-TP and a sensing driving board MB-TP. For example, a sensing bonding layer T-AP may be disposed between the input sensor ISU and the sensing flexible circuit board FB-TP. The sensing flexible circuit board FB-TP may include sensing connection pads CPD-T which are disposed on one side of the input sensor ISU and correspond to a plurality of sensing pads TPD. The sensing flexible circuit board FB-TP may include a base film BF-T and the plurality of sensing connection pads CPD-T provided on one surface of the base film BF-T.

The sensing bonding layer T-AP may be disposed between the input sensor ISU and the sensing flexible circuit board FB-TP and include a plurality of conductive particles CP. The sensing bonding layer T-AP include sensing overlapping sections T-APO which overlap the sensing pads TPD and the sensing connection pads CPD-T corresponding to each other. For example, the sensing bonding layer T-AP include sensing non-overlapping sections T-APN which do not overlap the sensing pads TPD and the sensing connection pads CPD-T. The same features described in the bonding layer AP may be applied to the sensing bonding layer T-AP. For example, in each of the sensing non-overlapping section T-APN, the conductive particles CP may be disposed adjacent to one side of one sensing pad TPD of the neighboring sensing pads.

The display device includes the bonding layer in which the arrangement of the conductive particles is controlled such that the conductive particles to be disposed between the pads are disposed adjacent to only one side of one pad of the neighboring pads, and thus may have the characteristics in which the short circuit failure between the conductive particles and the pads is reduced. For example, the bonding layer in which the arrangement of the conductive particles is controlled is provided even in a high-resolution display device in which distances between the neighboring pads, the pitches, become small, and thus, the excellent reliability may be ensured.

Hereinafter, a method of manufacturing a display device of an embodiment will be described with reference to FIGS. 10, 11, 12, 13, and 14. In the method of manufacturing a display device of the embodiment described hereinafter, duplicated features with those of the display device of the embodiment described above are not described again, and their differences will be mainly described to avoid redundancy.

Figure 10:
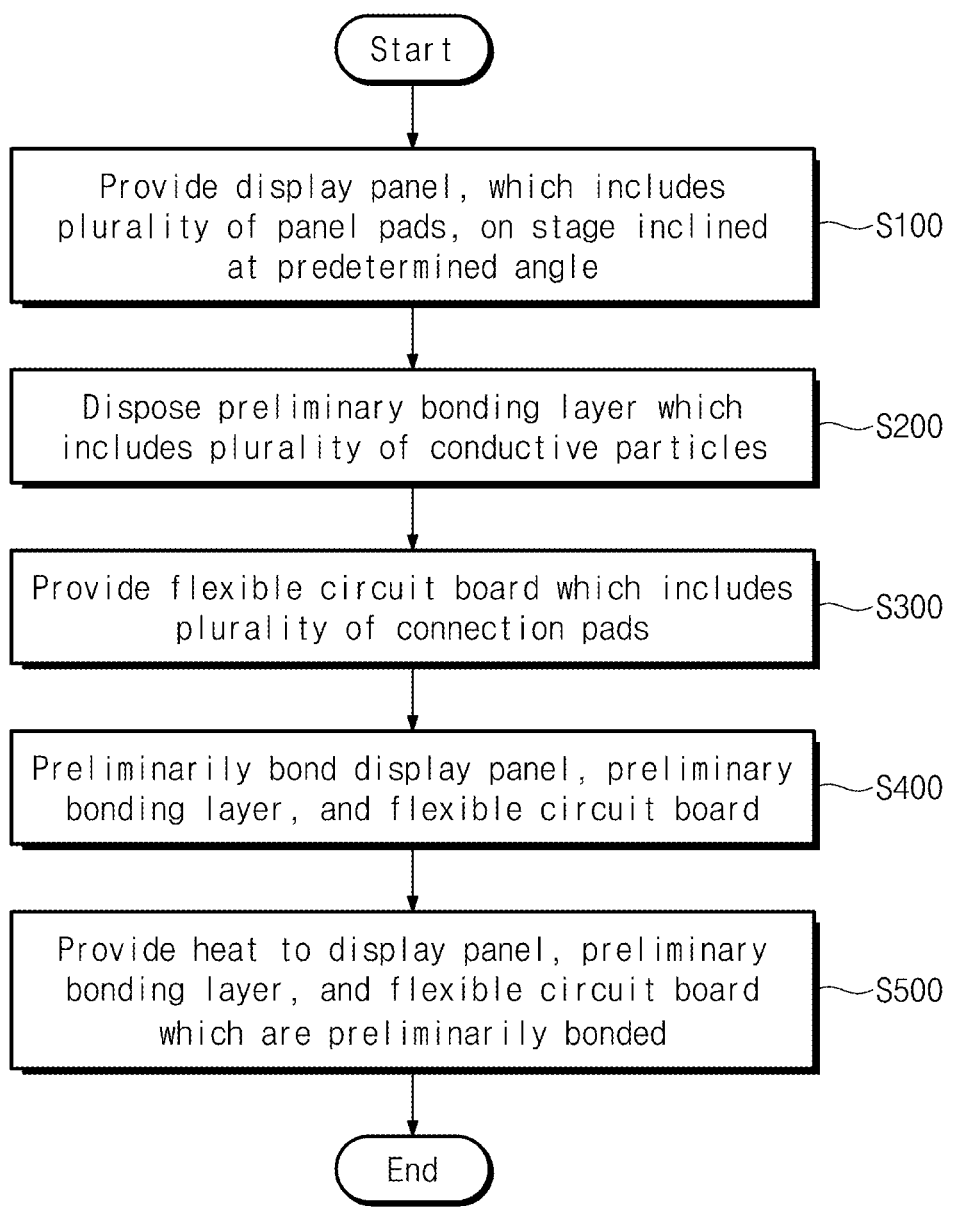
FIG. 10 is a flow chart illustrating an embodiment of a method of manufacturing a display device according to the principles of the invention.
Figure 11:
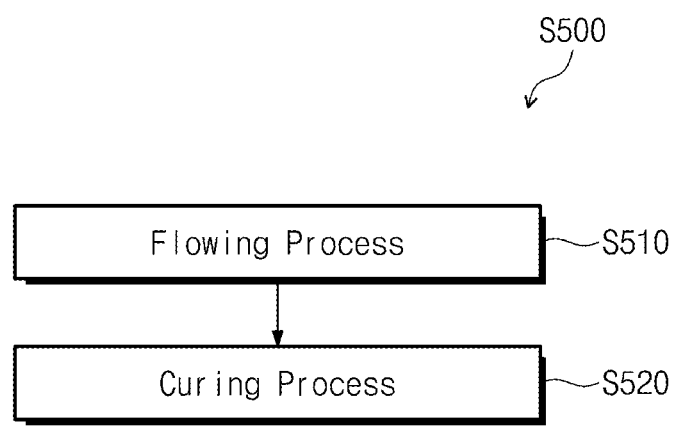
FIG. 11 is a flow chart illustrating a portion of the method of manufacturing the display device of FIG. 10.
Figure 12:
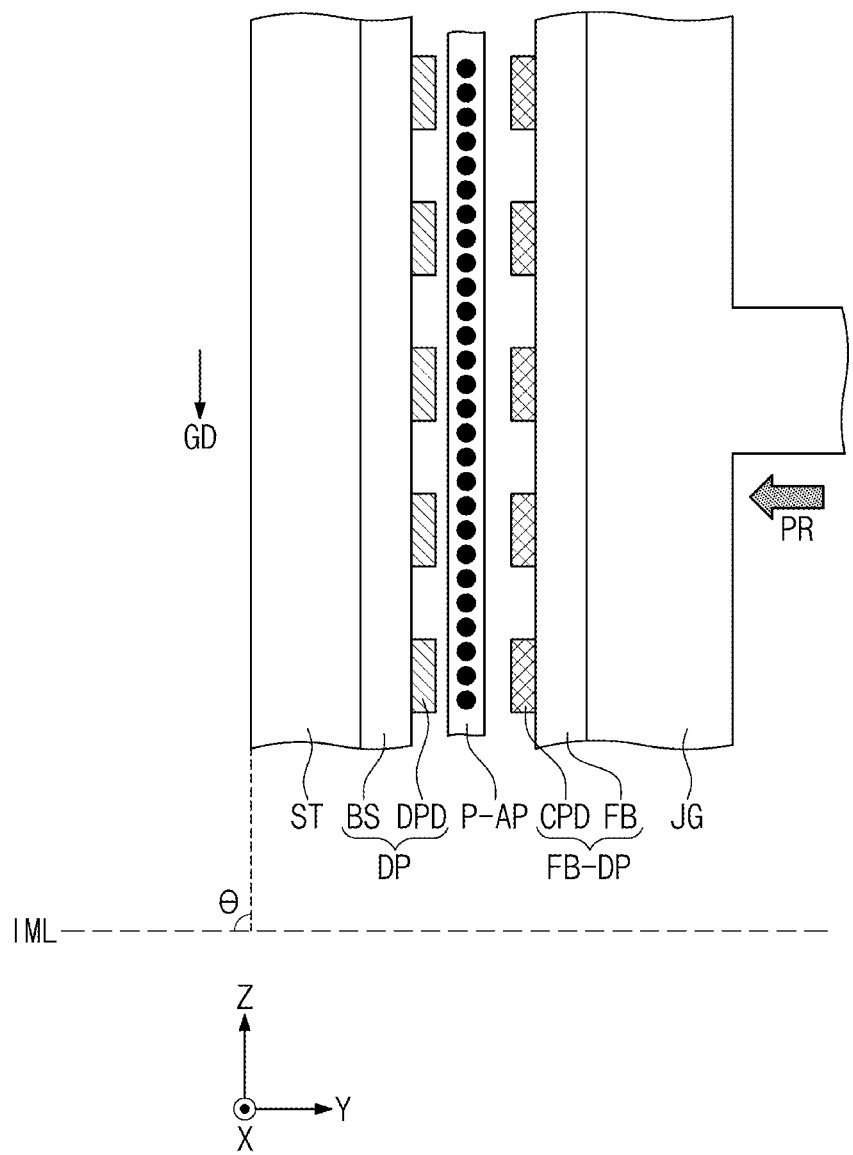
FIG. 12 is a schematic view illustrating one process of the method of manufacturing the display device of FIG. 10.
Figure 13:
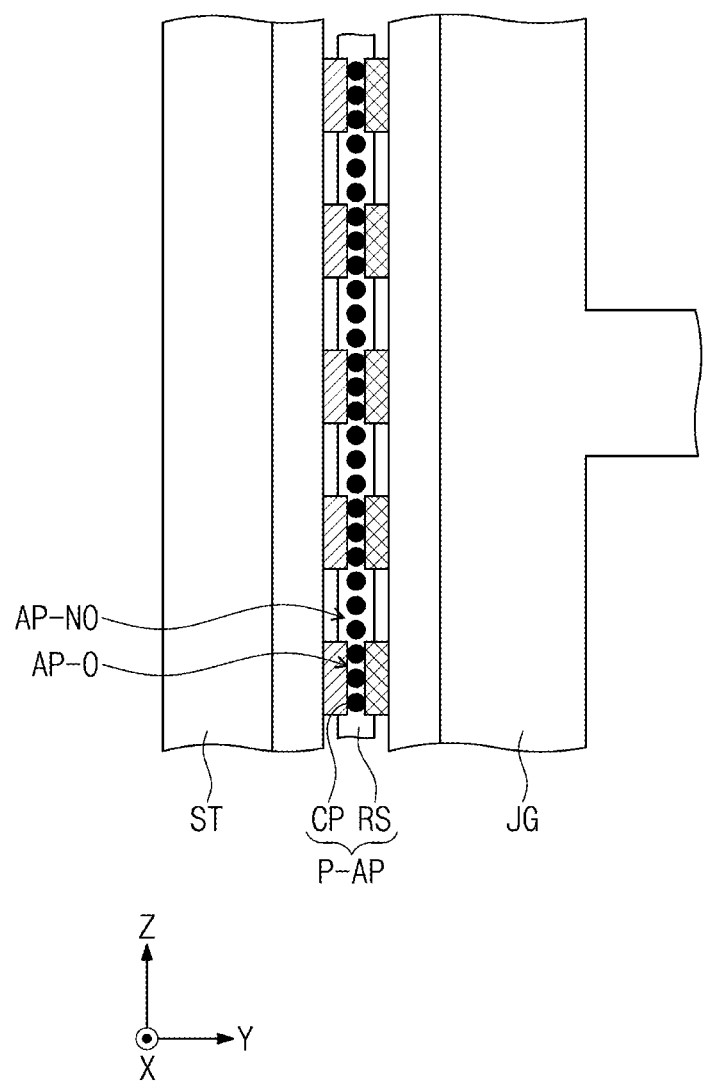
FIG. 13 is a schematic view illustrating one process of the method of manufacturing the display device of FIG. 10.
Figure 14:
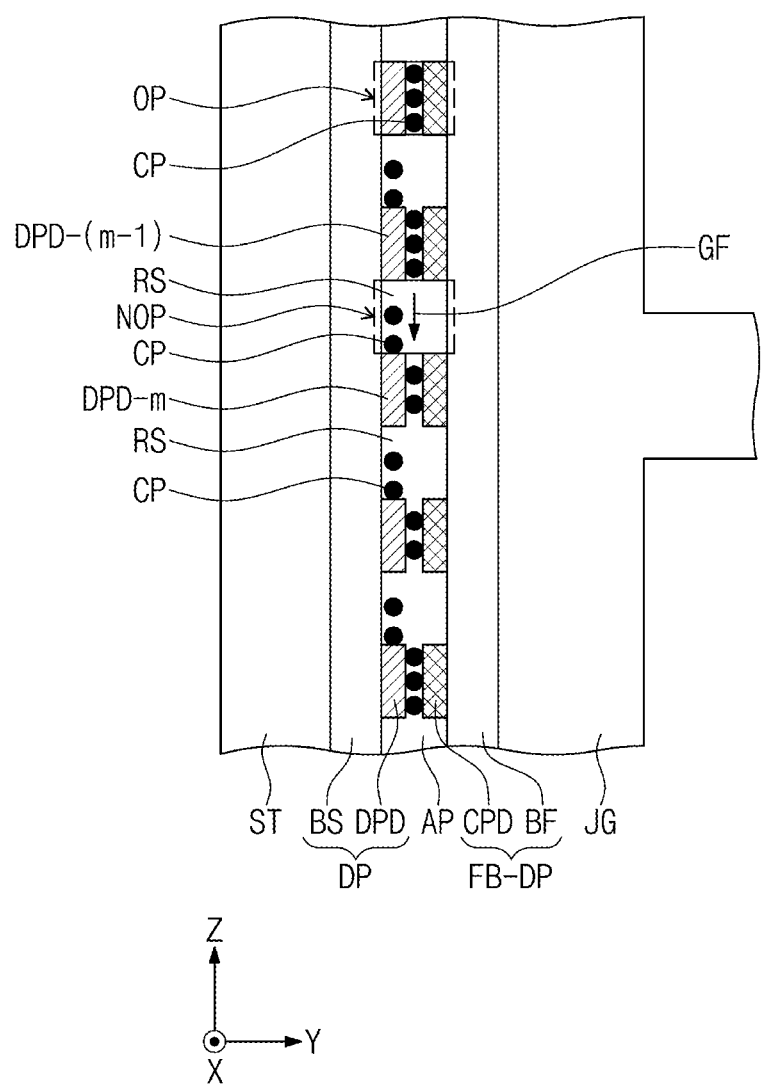
FIG. 14 is a schematic view illustrating one process of the method of manufacturing the display device of FIG. 10.

Each of FIGS. 10 and 11 is a flow chart of a method of manufacturing a display device. FIGS. 12 to 14 are schematic views of a portion of processes corresponding to processes of the method of manufacturing a display device according to the embodiment illustrated in FIGS. 10 and 11.

The method of manufacturing a display device may include: providing a display panel, which includes a plurality of panel pads, on a stage inclined at a predetermined angle (S100); disposing a preliminary bonding layer which includes a plurality of conductive particles (S200); providing a flexible circuit board which includes a plurality of connection pads (S300); preliminarily bonding the display panel, the preliminary bonding layer, and the flexible circuit board (S400); and providing heat to the display panel, the preliminary bonding layer, and the flexible circuit board which are preliminarily bonded.

FIGS. 12 and 13 show that the display panel, the preliminary bonding layer, and the flexible circuit board are sequentially provided. A display panel DP including a plurality of panel pads DPD is provided on a stage ST. The stage ST may be inclined at a predetermined angle θ. The predetermined angle θ may be about 0 degree to about 90 degrees. The angle θ at which the stage ST is inclined may be defined relative to a virtual plane IML. The virtual plane IML illustrated in FIG. 12 may be a plane perpendicular to the gravitational direction GD. For example, the virtual plane IML may be a plane parallel to a plane defined by an X axis and a Y axis. Here, an X axis, a Y axis, and a Z axis illustrated in FIGS. 12, 13, and 14 are illustratively shown with respect to a user using an apparatus for manufacturing the display device. The plane seen in a viewing direction of the user is defined as a plane defined by the X axis and the Z axis.

The display panel DP may be disposed on the stage ST inclined at the predetermined angle θ. For example, the stage ST may include a vacuum suction part for fixing the display panel DP on a surface on which the display panel DP is disposed. A preliminary bonding layer P-AP including a plurality of conductive particles CP is provided on the display panel DP, and a flexible circuit board FB-DP may be disposed on the preliminary bonding layer P-AP sequentially. A plurality of connection pads CPD of the flexible circuit board FB-DP may be disposed to respectively correspond to a plurality of panel pads DPD.

The connection pads CPD are disposed on one surface of the flexible circuit board FB-DP, and a pressing jig JG may be disposed on the other surface thereof. Using the pressing jig JG, the display panel DP, the preliminary bonding layer P-AP, and the flexible circuit board FB-DP may be pressed. A pressing direction PR is a direction perpendicular to the stage ST.

The display panel DP, the preliminary bonding layer P-AP, and the flexible circuit board FB-DP, which are sequentially provided, may be preliminarily bonded by being pressed by the pressing jig JG. The preliminary bonding layer P-AP may include overlapping sections AP-O, each of which overlaps the panel pad DPD and the connection pad CPD, and non-overlapping sections AP-NO, each of which does not overlap the panel pad DPD and the connection pad CPD.

The preliminarily bonded state represents a state in which the conductive particles CP, which are disposed between the panel pad DPD and the connection pad CPD disposed to correspond to each other, are in electrical contact with the panel pad DPD and the connection pad CPD. For example, the conductive particles CP disposed in the overlapping section AP-O are pressed by the pressing jig JG in the preliminary bonding (S400) and thus may be fixed between the panel pad DPD and the connection pad CPD.

FIG. 14 shows a portion of the providing (S500) of the heat to the display panel, the preliminary bonding layer, and the flexible circuit board which are preliminarily bonded. Using the pressing jig JG, the heat may be provided to the preliminary bonding layer P-AP, the flexible circuit board FB-DP, and the like. For example, the heat may be provided by using the pressing jig JG so that the temperature of the preliminary bonding layer P-AP reaches about 170° C.±10° C. degrees. For example, the pressing jig JG is a part capable of pressing and heating, and the display panel DP, the preliminary bonding layer P-AP, and the flexible circuit board FB-DP may be heat-pressed using the jig JG.

Referring to FIG. 11, in the method of manufacturing a display device according to the embodiment, the providing (S500) of the heat may include performing a flowing process (S510) and a curing process (S520).

The flowing process (S510) in the method of manufacturing a display device according to the embodiment may be a process of reducing viscosity of resin RS included in the preliminary bonding layer P-AP. The heat is provided to the preliminary bonding layer P-AP during the providing (S500) of the heat, and the viscosity of the resin RS is reduced. Thus, the resin RS may have flowability. In a state in which the resin RS has the flowability, the conductive particles CP disposed in each of the non-overlapping sections AP-NO may move toward the panel pad DPD, which is at a relatively low side, due to the gravity GF in an inclined state. For example, in the method of manufacturing a display device according to the embodiment, the arrangement of the conductive particles CP may be controlled by using the gravity GF and the flowability of the resin RS.

In the providing (S500) of the heat, the conductive particles CP do not move in an overlapping section OP in which the conductive particles CP are fixed between the panel pad DPD and the connection pad CPD, but the conductive particles CP move toward the panel pad DPD, which is disposed at the relatively low side, in a non-overlapping section NOP in which the panel pad DPD and the connection pad CPD are not disposed.

In the method of manufacturing a display device according to the embodiment, the providing (S500) of the heat includes performing the flowing process (S510) and the curing process (S520), which may be classified with the lapse of time. In the specification, the curing process (S520) represents a state in which the conductive particles CP do not move due to the lowered flowability of the resin RS. Each of the resin RS may be being heat-cured by the heat provided. The heat-curing may be partially performed even in the flowing process (S510).

In the specification, the flowing process (S510) is described to represent a state in which the conductive particles CP have the flowability to make it possible to move even in a state in which the curing has been partially performed. Subsequently, the curing process (S520) is described to represent from a state in which the viscosity of the resin RS increases to such an extent as to limit the movement of the conductive particles CP to a state in which the resin RS are finally cured and solidified. However, this is described as an example, and the curing process (S520) and the flowing process (S510) may be performed as one integrated process. The curing process (S520) may include fixing the resin RS and the conductive particles CP to transform the preliminary bonding layer P-AP into a bonding layer AP.

In the method of manufacturing a display device according to the embodiment, the conductive particles CP may also be moved due to a difference in surface energy between the panel pad DPD and the resin RS. The conductive particles CP, which are particles containing metal, may be more easily moved toward the panel pad DPD having relatively hydrophilic properties than the resin RS. Thus, due to the gravity and hydrophilic properties of the panel pad DPD, the conductive particles CP in the non-overlapping section AP-NO may be disposed adjacent to only one side of the panel pad DPD.

The method of manufacturing a display device according to the embodiment includes disposing the display panel, the preliminary bonding layer, and the flexible circuit board on the inclined stage, and providing the heat to the display panel, the preliminary bonding layer, and the flexible circuit board which have been preliminarily bonded. The method may be used to manufacture the display device which has the favorable reliability due to the movement of the conductive particles contained in the preliminary bonding layer.

For example, the display device includes the bonding layer in which the conductive particles, which do not overlap the pads and are disposed between the neighboring pads, are arranged toward the one side of the one pad, and thus, the excellent reliability may be achieved. Here, the display device includes the bonding layer in which the conductive particles to be disposed between the neighboring pads are disposed adjacent to only the one side of the one pad, and thus, the excellent reliability may be achieved even in a case having the pads which are arranged in high definition to achieve the high resolution.

The display device according to the embodiment includes the bonding layer in which the conductive particles to be disposed in the area that does not overlap the pad are arranged while being aligned with the one side of the pad, and thus may have the improved reliability.

The method of manufacturing a display device according to the embodiment includes controlling the movement of the conductive particles in the bonding layer provided between the display panel and the circuit board, and thus, the display device having the excellent reliability even in high resolution may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a panel comprising a plurality of panel pads;
a circuit board comprising a plurality of connection pads corresponding to the plurality of panel pads, respectively; and
a layer disposed between the panel and the circuit board and comprising a plurality of conductive particles,
wherein the layer comprises:
an overlapping portion that overlaps the plurality of panel pads and the plurality of connection pads in a first direction; and
a non-overlapping portion that does not overlap the plurality of panel pads and the plurality of connection pads in the first direction,
wherein the plurality of panel pads comprise a first panel pad and a second panel pad adjacent to each other, and wherein:
the non-overlapping portion does not overlap the first panel pad and the second panel pad in the first direction, and
the plurality of conductive particles in the non-overlapping portion are spaced apart from a first side surface of the first panel pad and are adjacent to a second side surface of the second panel pad adjacent to the first side surface of the first panel pad in a second direction intersecting the first direction.

2. The display device of claim 1, wherein, in the non-overlapping portion, the conductive particles are in electrical contact with the second side surface of the second panel pad.

3. The display device of claim 1, wherein, in the non-overlapping portion, the conductive particles are insulated from the first side surface of the first panel pad.

4. The display device of claim 1, wherein, in the non-overlapping portion, the conductive particles are closer to the second side surface of the second panel pad than the first side surface of the first panel pad based on a virtual center line at a same distance from the first side surface of the first panel pad and the second side surface of the second panel pad.

5. The display device of claim 1, wherein the conductive particles are randomly arranged in the overlapping portion.

6. The display device of claim 1, wherein:
the panel is a display panel,
the circuit board is a flexible circuit board, and
on a plane parallel to the display panel, the conductive particles in the overlapping portion are not in contact with each other.

7. The display device of claim 1, wherein, on a plane parallel to the panel, the conductive particles adjacent to the second side surface of the second panel pad are aligned in a single layer.

8. The display device of claim 1, wherein:
the layer is a bonding layer,
the bonding layer further comprises resin, and
gaps between the panel pads and the connection pads are filled with the resin.

9. The display device of claim 1, wherein the overlapping portion comprises the conductive particles formed in a single layer between the plurality of panel pads and the plurality of connection pads in the first direction.

10. The display device of claim 1, wherein the conductive particles in the overlapping portion do not overlap each other in the first direction.

11. The display device of claim 1, further comprising:
an input sensor disposed on the panel and comprising a plurality of sensing pads;
a sensing flexible circuit board comprising a plurality of sensing connection pads corresponding to the plurality of sensing pads, respectively; and
a sensing bonding layer disposed between the input sensor and the sensing flexible circuit board and comprising a plurality of conductive particles,
wherein the sensing bonding layer comprises:
a sensing overlapping portion overlapping the plurality of sensing pads and the plurality of sensing connection pads in the first direction; and
a sensing non-overlapping portion that does not overlap the plurality of sensing pads and the plurality of sensing connection pads in the first direction,
wherein, in the sensing non-overlapping portion, the conductive particles are disposed adjacent to one side of one sensing pad of adjacent sensing pads.

12. A display device comprising:
a display panel comprising a plurality of panel pads;
a flexible circuit board comprising a plurality of connection pads corresponding to the plurality of panel pads, respectively; and
a bonding layer disposed between the display panel and the flexible circuit board and comprising a plurality of conductive particles,
wherein the bonding layer comprises:
a plurality of overlapping portions, each of which overlaps a corresponding panel pad and a corresponding connection pad in a first direction; and
a plurality of non-overlapping portions, each of which does not overlap the corresponding panel pad and the corresponding connection pad in the first direction,
wherein the plurality of panel pads comprise a (m−1)-th panel pad and a m-th panel pad adjacent to each other, where m is an integer greater than zero, and wherein:
the non-overlapping portion does not overlap the (m−1)-th panel pad and the m-th panel pad in the first direction, and
the plurality of conductive particles in the non-overlapping portion are spaced apart from one side surface of the (m−1)-th panel pad and are adjacent to one side surface of the m-th panel pad adjacent to the one side surface of the (m−1)-th panel pad in a second direction intersecting the first direction.

13. The display device of claim 12, wherein the conductive particles, adjacent to the one side surface of the m-th panel pad, are in electrical contact with the one side surface of the m-th panel pad.

14. A method of manufacturing a display device, the method comprising the steps of:
providing a display panel comprising a plurality of panel pads, on a stage inclined at a predetermined angle;
disposing a preliminary bonding layer comprising a plurality of conductive particles, on the panel pads;
providing a flexible circuit board comprising a plurality of connection pads, on the preliminary bonding layer;
preliminarily bonding the display panel, the preliminary bonding layer, and the flexible circuit board, sequentially, in a pressing manner; and
providing heat to the display panel, the preliminary bonding layer, and the flexible circuit board after the step of preliminarily bonding,
wherein the preliminary bonding layer comprises resin filling gaps between the conductive particles are filled,
wherein, the step of providing of the heat comprises the steps of:
performing a flowing process of reducing viscosity of the resin; and
performing a curing process of fixing the resin and the conductive particles, after the flowing process, and transforming the preliminary bonding layer into a bonding layer.

15. The method of claim 14, wherein the preliminary bonding layer comprises overlapping portions that overlap the panel pads and the connection pads and non-overlapping portions that do not overlap the panel pads and the connection pads, and
in the step of preliminary bonding, the plurality of conductive particles in the overlapping portions are in electrical contact with the panel pads and the connection pads facing each other.

16. The method of claim 15, wherein, the step of providing of the heat comprises the step of moving the conductive particles in the non-overlapping portions, toward a lower panel pad of two adjacent panel pads.

17. The method of claim 14, wherein the predetermined angle is greater than about 0 degree and about 90 degrees or less.

* * * * *